United States Patent [19]
Igel

[11] Patent Number: 5,976,901
[45] Date of Patent: Nov. 2, 1999

[54] PROCESS FOR MANUFACTURING SEMICONDUCTOR DEVICES WITH ACTIVE STRUCTURES

[75] Inventor: Gunter Igel, Teningen, Germany

[73] Assignee: General Semiconductor Inc., Melville, N.Y.

[21] Appl. No.: 08/804,422

[22] Filed: Feb. 21, 1997

[30] Foreign Application Priority Data

Feb. 24, 1996 [DE] Germany ............................ 196 07 047

[51] Int. Cl.$^6$ ............................ G01R 31/26; H01L 21/66
[52] U.S. Cl. ................................ 438/17; 438/14; 438/18
[58] Field of Search .................................. 438/14, 17, 18

[56] References Cited

U.S. PATENT DOCUMENTS

| | | |
|---|---|---|
| 3,704,375 | 11/1972 | Slawek, Jr. et al. . |
| 4,040,877 | 8/1977 | Johnson et al. . |
| 4,236,296 | 12/1980 | Woolhouse et al. . |
| 5,240,866 | 8/1993 | Friedman et al. .......................... 438/17 |
| 5,252,507 | 10/1993 | Hively et al. . |
| 5,256,578 | 10/1993 | Corley et al. .............................. 438/17 |
| 5,399,505 | 3/1995 | Dasse et al. ............................... 438/17 |
| 5,523,252 | 6/1996 | Saito ......................................... 438/18 |
| 5,605,844 | 2/1997 | Ohi et al. ................................... 438/17 |
| 5,627,083 | 5/1997 | Tounaz ...................................... 438/18 |

FOREIGN PATENT DOCUMENTS

0721220A2  7/1996  European Pat. Off. .

3243307A1  5/1994  Germany .

OTHER PUBLICATIONS

Patent Abstract of Japan, vol. 11, No. 92 (E–491), Mar. 29, 1987 & JP 61 244045 A, Oct. 30, 1986.

Patent Abstract of Japan, vol. 14, No. 216 (E–0921), May 8, 1990 & JP 02 051253 A, Feb. 21, 1990.

Patent Abstract of Japan, vol. 17, No. 657 (E–1470), Dec. 6, 1993 & JP 05 218353 A, Aug. 27, 1993.

Patent Abstract of Japan, vol. 18, No. 83 (M–1558), Feb. 10, 1994 & JP 05 294011 A, Jan. 9, 1993.

Brickman, Redundant Memory Cell and Decoder, *IBM Technical Disclosure Bulletin*, vol. 13, No. 7, Dec. 1970.

German Search Report for German Application 196 07 047.3–33, Oct. 11, 1996.

*Primary Examiner*—Kevin M. Picardat
*Assistant Examiner*—D. M. Collins
*Attorney, Agent, or Firm*—Arthur L. Plevy

[57] ABSTRACT

The invention relates to a process for manufacturing semiconductor devices with active device structures which are connected with one another in a wafer, the area of a semiconductor device being determined by process parameters and being substantially greater than the area of an active device structure. An improvement of the process is achieved by forming several like active device structures on each of the semiconductor devices.

14 Claims, 1 Drawing Sheet

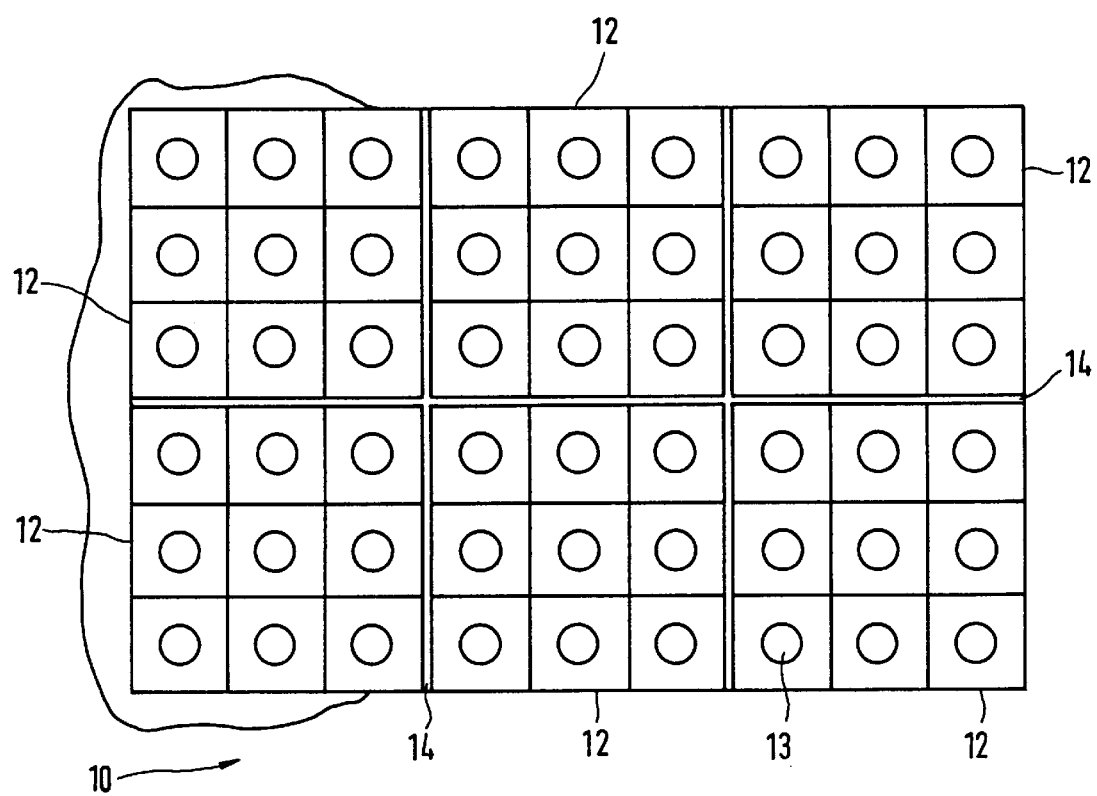

PROCESS FOR MANUFACTURING SEMICONDUCTOR DEVICES WITH ACTIVE STRUCTURES

FIELD OF INVENTION

The present invention relates to a process for manufacturing semiconductor devices with active structures which are connected with one another in a wafer, the area of a semiconductor device being determined by process parameters and being substantially greater than the area of an active structure.

BACKGROUND OF THE INVENTION

Processes for manufacturing semiconductor devices having active device structures which are connected together with each other in a wafer are well known in the art. The minimum area of such a semiconductor device is frequently determined by processing parameters. For example, a tolerance zone between the semiconductor devices is required to separate the individual devices. This tolerance zone must be taken into account in determining the minimum area of a semiconductor device. For this tolerance zone, a corresponding additional area is necessary. After the device-separation step, the individual devices must be transported, i.e., they must be capable of being mechanically handled. A semiconductor device separated from the wafer is, for example, placed on a lead frame and attached thereto by bonding, using for example, an adhesive bonding or soldering technique. This contributes to the minimum size of the semiconductor devices, which in many cases is a contributory factor in determining the area of a semiconductor device. There are many applications in which the active structure that is deposited on such a semiconductor device, is substantially smaller than the area of the device required for mechanical handling. As a result, the manufacturing process becomes expensive, since a considerable portion of the semiconductor material is not used to obtain the desired properties of the device. A further increase in manufacturing costs results from active device structures which are frequently faulty. Such faults can be detected by testing the active device structures. Faulty structures or structures which do not meet a user's requirements are commonly marked with an ink and are not attached to the lead frame. After being attached to the lead frame, the chips are commonly fed to a wire bonder for making electrical connections to the active device structures.

It is the object of the invention to provide an improved, lower-cost process for manufacturing semiconductor devices with active device structures.

SUMMARY

The present invention is directed to a process for manufacturing semiconductor chips on a wafer. The process comprises the steps of forming duplicate, active device structures on each of the semiconductor chips, measuring each one of the active device structures to provide a measurement result therefor which is indicative of at least one physical parameter of the active device structures, and using the measurement results to determine which one of the active device structures on each of the semiconductor chips is to be used for a future electrical connection.

Another aspect of the present invention involves the step of separating the semiconductor chips after the step of comparing.

In one embodiment of the present invention, the active device structures are electronic structures, and the at least one physical parameter is an electrical quantity.

In another embodiment of the present invention, the step of using the measurement result further includes the steps of storing the measurement results together with a quantity assigned to each respective one of the active device structures on a one-to-one basis, and comparing the measurement results to predetermined values to determine which one of the active device structures on each one of the semiconductor chips is to be used for the future electrical connection.

In still another embodiment of the present invention, the step of using the measurement result further includes the steps of storing the measurement results together with a quantity assigned to each respective one of the active device structures on a one-to-one basis, and comparing the measurement results of the active device structures of one of the semiconductor chips to the measurement results of the active device structures of at least one other of the semiconductor chips to determine for each of the semiconductor chips, which one of the active device structures is to be used for the future electrical connection.

BRIEF DESCRIPTION OF THE DRAWINGS

For a better understanding of the present invention, reference is made to the following description, considered in conjunction with the accompanying drawing, in which:

FIG. 1 is a top plan view showing a portion of a wafer with semiconductor devices.

DETAILED DESCRIPTION OF THE INVENTION

The process of the present invention generally involves forming several essentially identical active device structures on each one of a plurality of semiconductor devices. In this manner, the area of the semiconductor device is used more efficiently. When the active device structures formed on a semiconductor device are tested, the structure best suited for the respective application can be selected and used. The probability that a semiconductor device cannot be used decreases with the number of active device structures formed on it. This results in a substantial increase in the yield of semiconductor devices which meet a given set of specified requirements. The manufacturing costs of the semiconductor devices decrease considerably. The advantages are already achieved if, because of the process parameters, the device area is at least twice as great as the area of the active device structures.

Referring now to FIG. 1, an exemplary embodiment of the present invention is shown. In particular, a wafer portion 10 contains six semiconductor devices 12. On each of these semiconductor devices 12, there is provided nine, essentially identical active device structures 13. Separation regions 14 are provided between the semiconductor devices 12. On the separation regions 14, no active device structure 13 can be formed, because these regions are required to separate the semiconductor devices 12 from the wafer 10. In the separation regions 14, material is removed by sawing, for example.

In the example shown, instead of one active device structure 13 as is the case in prior art process, nine active device structures 13 have been formed on each semiconductor device 12 thus, the area of the semiconductor device is used more efficiently. Such active device structures are formed using conventional techniques which involve a sequence of masking, photoresist coating, exposure, etching, doping, and deposition steps as required for the respective active device structure. If several active device structures 13 are formed on each of the semiconductor devices 12, the number of those steps remains unchanged, so that this does not add to the process complexity. A typical application are electronic devices, such as discrete semiconductor devices or small IC chips. The individual active device structures 13 of the semiconductor devices 12 are generally tested on the wafer 10. Electronic devices must frequently meet specific electrical requirements. To determine this, the necessary electrical parameters can be measured. It is possible to determine by a comparison which of the active device structures 13 of each semiconductor device 12 is to be used as will be explained further. It will also be discussed later on in greater detail that, it is also possible to store the electrical parameters and compare them with corresponding reference values, either predetermined parameters or values of the active device structures 13 of the other semiconductor devices 12. This necessitates storing together with the measured parameters a quantity assigned to the respective active device structure on a one-to-one basis from which the location of the active device structure 13 on the semiconductor device 12 can be determined. The semiconductor devices 12 are separated from the wafer 10 using a conventional technique, and attached to a lead frame, for example. They may be attached to the lead frame by bonding, for example. After attachment to the lead frame, the semiconductor devices 12 are fed to a wire bonder, for example, where electrical connections are made to the active device structures 13 which are to be used in accordance with the measurement results.

It is preferred that an electrical connection is made to one active structure of a respective semiconductor device. The device area required to make this connection, e.g., by wire bonding, is, as a rule, substantially smaller than the area required to handle the devices. In today's technology, an edge length of 250 μm is required to mechanically transport a semiconductor device, whereas an edge or structure length of only 50 μm would be necessary for wire bonding. In the latter case, 25 active device structures could be formed on a semiconductor device. If one of them is used and an electrical connection is made to it, the probability that the device can be used for its intended function increases in accordance with the multiplication of the probabilities.

Advantageously, at least one physical parameter of the active device structures is measured, and the active structure of a semiconductor device to which an electrical connection is made is determined on the basis of the result of the measurement. This makes it possible to compare the structures, so that the best structure can be determined for the respective application.

In another embodiment of the present invention, each of the physical parameters is stored together with a quantity assigned to the respective active structure on a one-to-one basis, the parameters are compared with predetermined values, and the active structure of a semiconductor device to which an electrical connection is made is determined on the basis of the result of this comparison. This makes it possible to select the active element of each semiconductor device which comes closest to the predetermined parameters.

It is also possible to store each of the physical parameters together with a quantity assigned to the respective active structure on a one-to-one basis, to compare the parameters of the active device structures of a semiconductor device with the parameters of the active device structures of at least one other semiconductor device, and to determine from the result of this comparison to which active structure of the respective semiconductor device an electrical connection is made. This makes it possible to determine active device structures of the semiconductor devices which, for example, have identical parameters and thus meet identical requirements. Preferably, the active device structures are electronic structures and the physical parameters are electrical quantities. However, the process according to the invention is also applicable to all other active device structures, such as optical, electrooptical, and magnetic structures, sensors, and the like.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A process for manufacturing semiconductor chips on a wafer, the process comprising the steps of:

forming duplicate, active device structures on each of the semiconductor chips;

measuring each one of the active device structures to provide a measurement result therefor which is indicative of at least one physical parameter of the active device structures; and using the measurement results to determine which one of the active device structures on each of the semiconductor chips is to be used for a future electrical connection.

2. The process according to claim 1, wherein the active device structures are electronic structures, and the at least one physical parameter is an electrical quantity.

3. The process according to claim 1, further comprising the step of separating the semiconductor chips after the step of comparing.

4. The process according to claim 1, wherein the step of using the measurement result further includes the steps of:

storing the measurement results together with a quantity assigned to each respective one of the active device structures on a one-to-one basis; and comparing the measurement results to given values to determine which one of the active device structures on each one of the semiconductor chips is to be used for the future electrical connection.

5. The process according to claim 4, wherein the active device structures are electronic structures, and the at least one physical parameter is an electrical quantity.

6. The process according to claim 1, wherein the step of using the measurement result further includes the steps of:

storing the measurement results together with a quantity assigned to each respective one of the active device structures on a one-to-one basis; and comparing the measurement results of the active device structures of one of the semiconductor chips to the measurement results of the active device structures of at least one other of the semiconductor chips to determine for each of the semiconductor chips, which one of the active device structures is to be used for the future electrical connection.

7. The process according to claim 6, wherein the active device structures are electronic structures, and the at least one physical parameter is an electrical quantity.

8. A process for manufacturing semiconductor chips on a wafer, each of the semiconductor chips having a first area used for forming a single active device structure and a second area used for further semiconductor processing and handling, the process comprising the steps of:

forming duplicate, active device structures on each of the semiconductor chips, wherein at least one of said active device structures is formed in said second area used for the further semiconductor processing and handling;

measuring each one of the active device structures to provide a measurement result therefor which is indicative of at least one physical parameter of the active device structures; and using the measurement results to determine which one of the active device structures on each of the semiconductor chips is to be used for a future electrical connection.

9. The process according to claim 8, wherein the active device structures are electronic structures, and the at least one physical parameter is an electrical quantity.

10. The process according to claim 8, further comprising the step of separating the semiconductor chips after the step of comparing.

11. The process according to claim 8, wherein the step of using the measurement result further includes the steps of storing the measurement results together with a quantity assigned to each respective one of the active device structures on a one-to-one basis; and comparing the measurement results to given values to determine which one of the active device structures on each one of the semiconductor chips is to be used for the future electrical connection.

12. The process according to claim 11, wherein the active device structures are electronic structures, and the at least one physical parameter is an electrical quantity.

13. The process according to claim 8, wherein the step of using the measurement result further includes the steps of:

storing the measurement results together with a quantity assigned to each respective one of the active device structures on a one-to-one basis; and comparing the measurement results of the active device structures of one of the semiconductor chips to the measurement results of the active device structures of at least one other of the semiconductor chips to determine for each of the semiconductor chips, which one of the active device structures is to be used for the future electrical connection.

14. The process according to claim 13, wherein the active device structures are electronic structures, and the at least one physical parameter is an electrical quantity.

* * * * *